(12) United States Patent
Ma (10) Patent No.: US 7,825,711 B2
(45) Date of Patent: Nov. 2, 2010

(54) CLOCK JITTER COMPENSATED CLOCK CIRCUITS AND METHODS FOR GENERATING JITTER COMPENSATED CLOCK SIGNALS

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/416,822

(22) Filed: Apr. 1, 2009

(65) Prior Publication Data

US 2010/0253404 A1 Oct. 7, 2010

(51) Int. Cl.
*H03L 7/06* (2006.01)
(52) U.S. Cl. ........................ 327/158; 327/149
(58) Field of Classification Search ................. 327/149, 327/158
See application file for complete search history.

(56) References Cited

U.S. PATENT DOCUMENTS

| | | | | |
|---|---|---|---|---|
| 6,677,793 B1* | 1/2004 | Chan et al. | ................. | 327/158 |
| 7,336,752 B2* | 2/2008 | Vlasenko et al. | ............ | 375/376 |
| 7,352,165 B2* | 4/2008 | Loke et al. | ............... | 324/76.53 |
| 7,368,961 B2* | 5/2008 | Werner et al. | ............... | 327/156 |
| 7,436,231 B2* | 10/2008 | Choi | ......................... | 327/158 |
| 7,446,579 B2* | 11/2008 | Kim et al. | ................... | 327/158 |
| 7,471,130 B2* | 12/2008 | Gomm et al. | ................ | 327/158 |
| 7,495,487 B2* | 2/2009 | Ma et al. | .................... | 327/158 |
| 7,619,453 B2* | 11/2009 | Ma et al. | .................... | 327/158 |
| 7,636,007 B2* | 12/2009 | Wakayama et al. | ......... | 327/408 |
| 7,642,827 B2* | 1/2010 | Kwak | .......................... | 327/158 |
| 7,701,272 B2* | 4/2010 | Ma | ............................. | 327/158 |
| 7,719,334 B2* | 5/2010 | Kwak | .......................... | 327/158 |
| 7,728,637 B2* | 6/2010 | Choi | ........................... | 327/156 |
| 7,728,639 B2* | 6/2010 | Gomm et al. | ............... | 327/158 |
| 2006/0097763 A1* | 5/2006 | Schmitt et al. | ............. | 327/158 |
| 2008/0246520 A1* | 10/2008 | Ma et al. | .................... | 327/158 |
| 2008/0297215 A1 | 12/2008 | Ma | ............................. | 327/158 |
| 2008/0303568 A1* | 12/2008 | Werner et al. | ............... | 327/158 |
| 2009/0146712 A1* | 6/2009 | Ma et al. | .................... | 327/158 |
| 2009/0295442 A1* | 12/2009 | Kwak | .......................... | 327/158 |
| 2010/0085094 A1* | 4/2010 | Ma | ............................. | 327/158 |
| 2010/0085095 A1* | 4/2010 | Kwak | .......................... | 327/158 |
| 2010/0103746 A1* | 4/2010 | Ma | ....................... | 365/189.05 |

* cited by examiner

*Primary Examiner*—Lincoln Donovan
*Assistant Examiner*—Adam D Houston
(74) *Attorney, Agent, or Firm*—Dorsey & Whitney LLP (57) ABSTRACT

Clock circuits, memories and methods for generating a clock signal are described. One such clock circuit includes a delay locked loop (DLL) configured to receive a reference clock signal and generate an output clock signal having an adjustable phase relationship relative to the reference clock signal, and further includes a clock jitter feedback circuit coupled to a clock tree and the DLL. The clock jitter feedback circuit is configured to synchronize a clock jitter feedback signal and a DLL feedback signal that is based on the output clock signal. The clock jitter feedback circuit is further configured to provide the clock jitter feedback signal to the DLL for synchronization with a buffered reference clock signal. The clock jitter feedback signal is based on and generated in response to receiving a distributed output clock signal from the clock tree circuit and the buffered reference signal is based on the reference clock signal.

22 Claims, 7 Drawing Sheets

ND CLOCK CIRCUITS AND METHODS FOR GENERATING JITTER COMPENSATED CLOCK SIGNALS

CLOCK JITTER COMPENSATED CLOCK CIRCUITS AND METHODS FOR GENERATING JITTER COMPENSATED CLOCK SIGNALS

TECHNICAL FIELD

Embodiments of the invention relate generally to clock circuits for generating clock signals, and more particularly, clock circuits for generating jitter compensated clock signals.

BACKGROUND OF THE INVENTION

Periodic signals are used in a variety of electronic devices. One type of periodic signal are clock signals that can be used to establish the timing of a signal or the timing at which an operation is performed on a signal. For example, data signals are typically coupled to and from memory, such as synchronous dynamic random access memory ("SDRAM"), in synchronism with a clock or data strobe signal. More specifically, read data signals are typically coupled from a memory in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal typically has a phase relative to the write data signals so that a write data strobe signal transitions during a "data eye" occurring at the center of the period in which the write data signals are valid.

Internal clock signals generated in electronic devices, for example, memory devices or memory controllers, are often synchronized or have some other controlled phase relationships relative to external or internal clock signals. For example, with reference to a memory, a clock signal used for both latching write data and outputting read data may be generated in the memory to which the data are being written. The clock signal is typically generated in the memory device from an internal clock signal that is also derived from the system clock signal.

Figure 1:
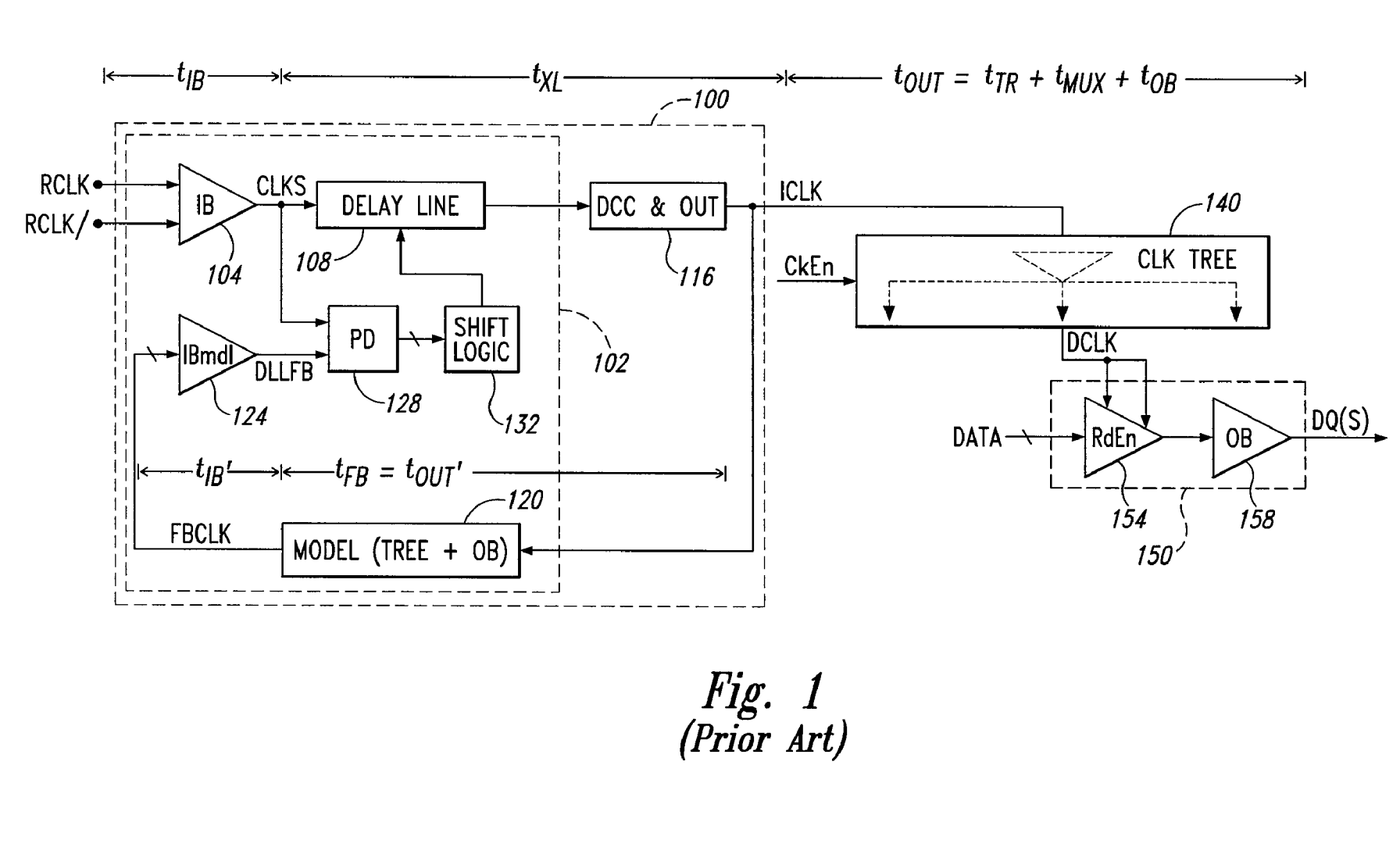
FIG. 1 is a block diagram of a conventional clock circuit.

Various techniques can be used to generate a clock signals or read/write data strobe signal. FIG. 1 illustrates a conventional clock circuit 100 providing an output clock signal ICLK to a clock tree circuit 140. When enabled by an active CkEn signal, the clock tree circuit 140 distributes the ICLK signal as a DCLK signal to various circuitry that operate according to the DCLK signal. In FIG. 1, the DCLK signal is provided to data output circuitry 150. In particular, the DCLK signal clocks a data register 154 which provides data to an output buffer 158 to generate a data output signal DQ. The clock circuit 100 generates an ICLK signal that when delayed through the clock tree circuit 140 results in a DCLK signal that is synchronized with a reference clock signal RCLK (and its complement RCLK/). The clock generator includes a delay-locked loop (DLL) 102 and a duty cycle correction (DCC) circuit and output buffer 116. The DLL includes an input buffer 104 that provides a buffered reference clock CLKS to a DLL delay line 108. The delayed buffered reference clock signal is output to the DCC and output buffer 116 for correction of the duty cycle and buffering before being output as the ICLK signal. The ICLK signal is also provided to a model delay 120. The model delay 120 models propagation delay through the output buffer and the clock tree circuit 140. A feedback clock signal FBCLK is output from the model delay 120 and provided through model delay 124 to a phase detector circuit 128 as the DLLFB signal. The model delay 124 models the propagation delay of the input buffer 104. The phase detector circuit 128 detects a phase difference between the CLKS and DLLFB signals. A phase difference signal indicative of the phase difference between the CLKS and DLLFB signals is provided to shift logic 132 that generates a control signal based on the phase difference signal to adjust the delay of the DLL delay line 108. The delay is increased or decreased in order to synchronize the CLKS and DLLFB signals. When synchronized, the clock circuit 100 is said to be "locked."

Although the timing of the ICLK signal relative to the RCLK (and RCLK/signal) is set by the clock circuit 100 so that the DQ signal output by the clock tree circuit 140 is synchronized with the RCLK signal, there may be a "jitter" in the DQ signal. The clock jitter may be caused by the resolution of adjustment in the DLL delay line 108, and also the resolution of the phase detection by the phase detector circuit 128. Clock jitter may also be caused by varying operating conditions, such as varying power, voltage, and temperature. For example, the ICLK signal may need to be driven over a relatively long signal line to be input in the clock tree circuit 140. Although the propagation delay to the clock tree circuit 140 and through the clock tree circuit 140 is modeled by the feedback model delay 120, the actual propagation delay due to the signal line may vary under changing operating conditions, thus, resulting in clock jitter.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As previously discussed, clock jitter may be introduced by performance characteristics of components of the clock circuit, as well as variation in operating conditions. The following equations are used to model jitter for a clock circuit, such as clock circuit 100 shown in FIG. 1.

Forward Path:

$$t_{IB}+t_{XL}+t_{OUT}=N*t_{CK}+t_{AC} \quad (1)$$

$$T_{IB}+\Delta t_{IB}+t_{XL}+\Delta t_{XL}+t_{OUT}+\Delta t_{OUT}=N*t_{CK}+t_{AC}+\Delta t_{AC} \quad (2)$$

$$\therefore \Delta t_{IB}+\Delta_{XL}+\Delta t_{OUT}=\Delta t_{AC} \quad \text{(a) (2)-(1)}$$

Feedback Path:

$$t_{IB'}+t_{XL}+t_{OUT}=N*t_{CK}\pm PD_{Resolution} \quad (3)$$

$$t_{IB'}+\Delta t_{IB'}+t_{XL}+\Delta t_{XL}+t_{OUT}+t_{OUT}=N'*t_{CK}\pm PD_{Resolution} \quad (4)$$

$$\therefore \Delta t_{XL}=-(\Delta t_{IB'}+t_{OUT})\bmod t_{CK} \quad \text{(b) (4)-(3)}$$

Where tIB is the input buffer 104 delay; tXL is the delay from the input of the DLL delay line 108 to the output of the DCC and output buffer 116; tOUT is the delay from the output of the DCC and output buffer 116 to the output of the output buffer 158; tCK is the period of RCLK; tAC is the jitter contribution; PDResolution is the phase detection resolution of the phase detector circuit 128; tOUT' is the delay from the output of the DCC and output buffer 116 to the output of the model delay 120; tIB' is the delay of the model input buffer delay 124.

In summary, a model for the systematic deterministic output jitter is:

$$t_{AC}=(t_{IB}-t_{IB'})+(t_{OUT}-t_{OUT'})\pm PD_{Resolution} \quad (1)-(3)$$

$$\Delta t_{AC}=(\Delta t_{IB}-\Delta t_{IB'})+(\Delta t_{OUT}-\Delta t_{OUT'}) \quad \text{(a)-(b)}$$

The jitter contributed by conventional clock circuit is:

$$t\text{Jitter}=\Delta t\text{Jitter}=t_{AC}+\Delta t_{AC}$$

Figure 4A:
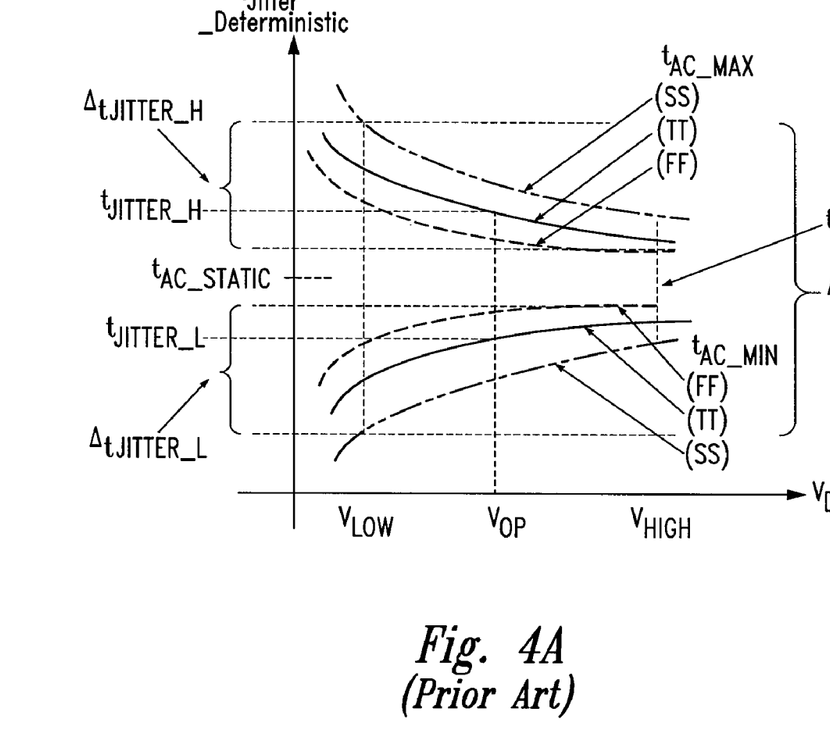
FIGS. 4A and 4B are graphs of the general relationship between clock jitter and a range of operating conditions for a conventional clock circuit and a clock circuit according to an embodiment of the invention.

Substituting (1)-(3) and (a)-(b) into the jitter contribution equation results in model for the systematic, predictable, deterministic jitter for a conventional clock circuit as indicated in FIG. 4A.

$$(t_{IB}-t_{IB'})+t_{OUT}-t_{OUT'})\pm PD_{Resolution}+ \\ (\Delta t_{IB}-\Delta t_{IB'})+(\Delta t_{OUT}-\Delta t_{OUT'})$$

Figure 4B:
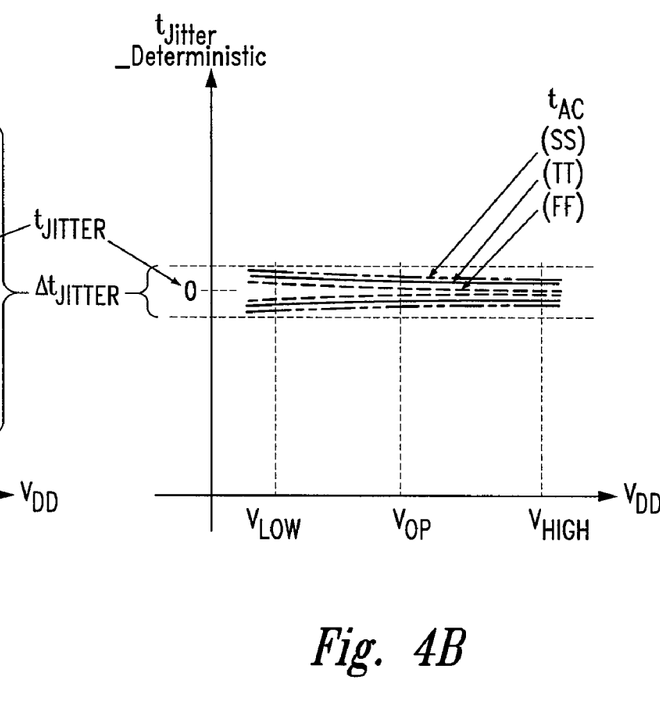

As will be described in more detail below, the range of jitter over a range of operating conditions for a conventional clock circuit may be wide. In contrast, some embodiments of the invention provide a bounded range of jitter as indicated in FIG. 4B.

Figure 2:
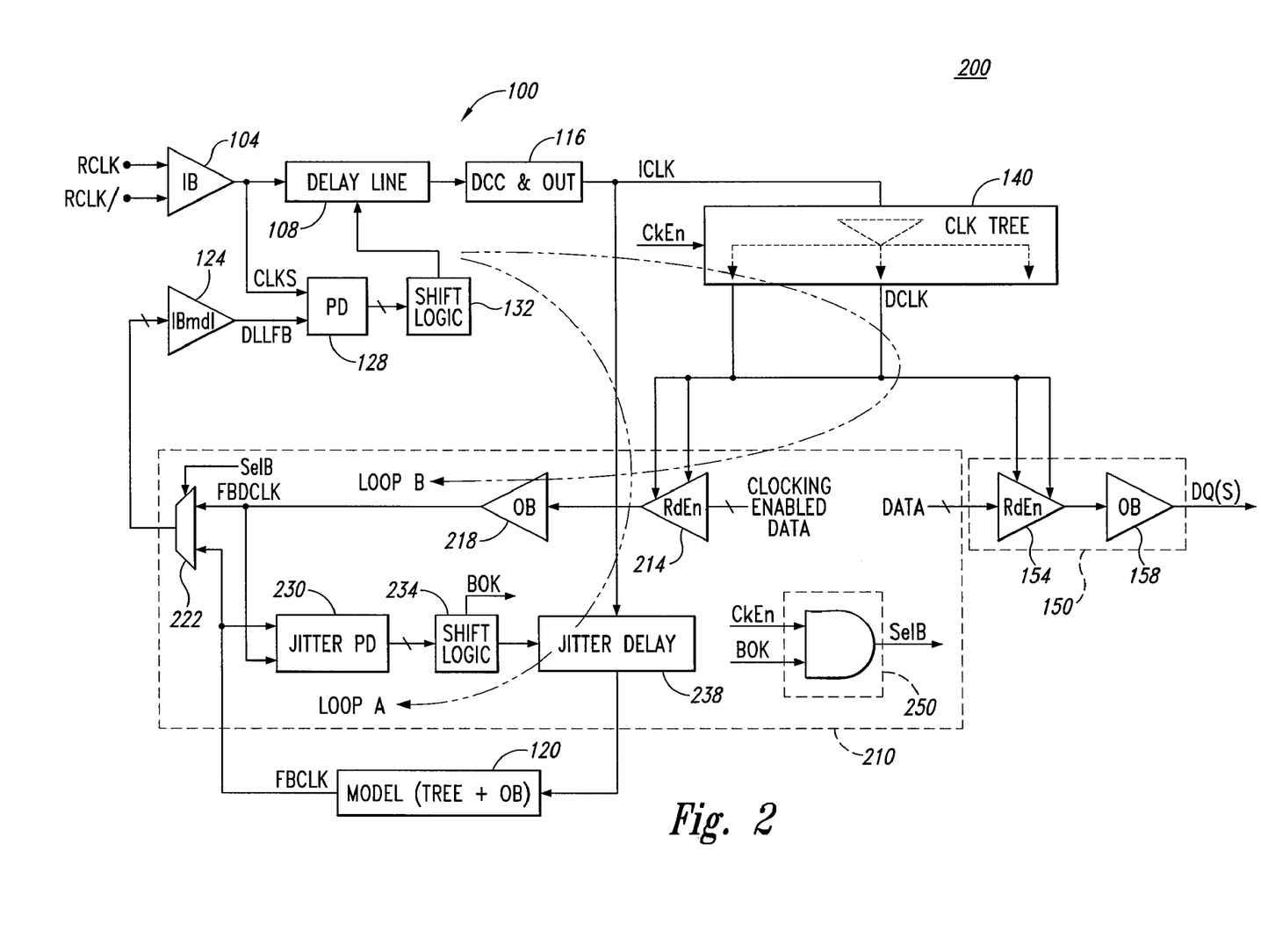
FIG. 2 is a block diagram of a clock circuit according to an embodiment of the invention.

FIG. 2 illustrates a clock generator 200 according to an embodiment of the invention. The clock generator 200 includes a conventional clock circuit 100 and a clock jitter feedback circuit 210. The clock circuit 100 includes a DLL/DCC clock circuit that generates an internal clock ICLK in response to a reference clock signal RCLK (and its complement RCLK/). Operation of the clock circuit 100 was previously described with reference to FIG. 1. As previously discussed with reference to FIG. 1, the clock tree circuit 140 and the data output circuitry 150 have inherent propagation delays that are modeled by the feedback model delay 120.

The clock jitter feedback circuit 210 includes a feedback path for the DCLK signal and locked loop circuitry to synchronize a feedback signal FBDCLK and the feedback clock signal FBCLK output from the model delay 120. The DCLK feedback path includes a clocked data register 214 and an output buffer 218. The clocked data register 214 and the output buffer 218 are included to model the propagation delay of the data register 154 and output buffer 158 of the data output circuitry 150. The data register 214 outputs clocking enabled data to the output buffer 218 in response to the DCLK signal and the output buffer 218 generates the FBDCLK signal in response. In one embodiment, the clocking enabled data is a data signal that changes states (i.e., 0 and 1) at the same frequency as the RCLK signal. In other embodiments, the clocking enabled data can change states at a different frequency than the RCLK signal. The FBDCLK signal is provided to a multiplexer 222 which also receives the FBCLK signal from the feedback model delay 120. The multiplexer selectively outputs the FBDCLK signal or the FBCLK signal to the input buffer model delay 124 under the control of a selection signal SelB. The selected signal is provided to the phase detector 108 as a DLL feedback signal DLLFB.

The locked loop circuitry of the clock jitter feedback circuit 210 includes a jitter phase detector circuit 230 that receives the FBDCLK signal and the FBCLK signal. The phase detector circuit 230 generates a phase difference signal indicative of the phase difference between the FBDCLK and FBCLK signals that is provided to shift logic 234. The shift logic 234 generates delay shift signals to adjust the delay of the jitter delay 238. This shift logic may include a majority averaging filter to set a threshold to generate qualified shifts. The jitter delay 238 provides an adjustable delay to the ICLK signal before being provided to the feedback model delay 120. The shift logic 234 further generates a DCLK sync signal BOK that is active when the FBDCLK and FBCLK signals are synchronized.

Logic circuitry 250 generates the SelB signal for controlling the multiplexer 222. The logic circuit 250 is illustrated in FIG. 2 as a logic AND gate having the CkEn and BOK signals as inputs.

In operation, the clock generator 200 uses a dual delay locked-loop arrangement to reduce clock jitter of the DQ outputs. That is, the clock jitter that is present in a conventional clock generator setup is reduced by feeding back the DCLK signal and synchronizing the resulting fed back DCLK signal (FBDCLK) with the FBCLK signal of the conventional clock circuit 100 in addition to synchronizing the buffered reference clock signal CLKS and the FBCLK signal (delayed by the model delay 124). When the clock tree 140 is enabled (active CkEn signal) and a DCLK signal is generated in response to the ICLK signal, the FBDCLK signal (delayed by the model delay 124) is synchronized with the CLKS signal. In this manner, the first order timing mismatch as well as the first order derivative of response mismatch are both taken into consideration in synchronizing the clock signals.

In modeling the jitter performance of the clock circuit 200, the following equations are utilized.

$$t_{OUT}-t_{OUT'}=\pm\text{JitterPD}_{Resolution}$$

$$t_{AC}=(t_{IB}-t_{IB'})+(t_{OUT}-t_{OUT'})\approx\pm\text{JitterPD}_{Resolution}\pm PD_{Resolution}$$

$$\Delta t_{AC}=(\Delta t_{IB}-\Delta t_{IB'})+(\Delta t_{OUT}-\Delta t_{OUT'})\approx\pm\Delta\text{JitterPD}_{Resolution}\pm\Delta PD_{Resolution}\approx\zeta(0)$$

The predictable jitter contributed by the clock circuit 200 can be modeled as:

$$t\text{Jitter}+\Delta t\text{Jitter}=t_{AC}+ \\ \Delta t_{AC}\approx\pm\text{JitterPD}_{Resolution}\pm PD_{Resolution}$$

That is, the jitter can be bounded by the phase detectors designs as previously discussed with reference to FIGS. 4A and 4B.

Figure 3:
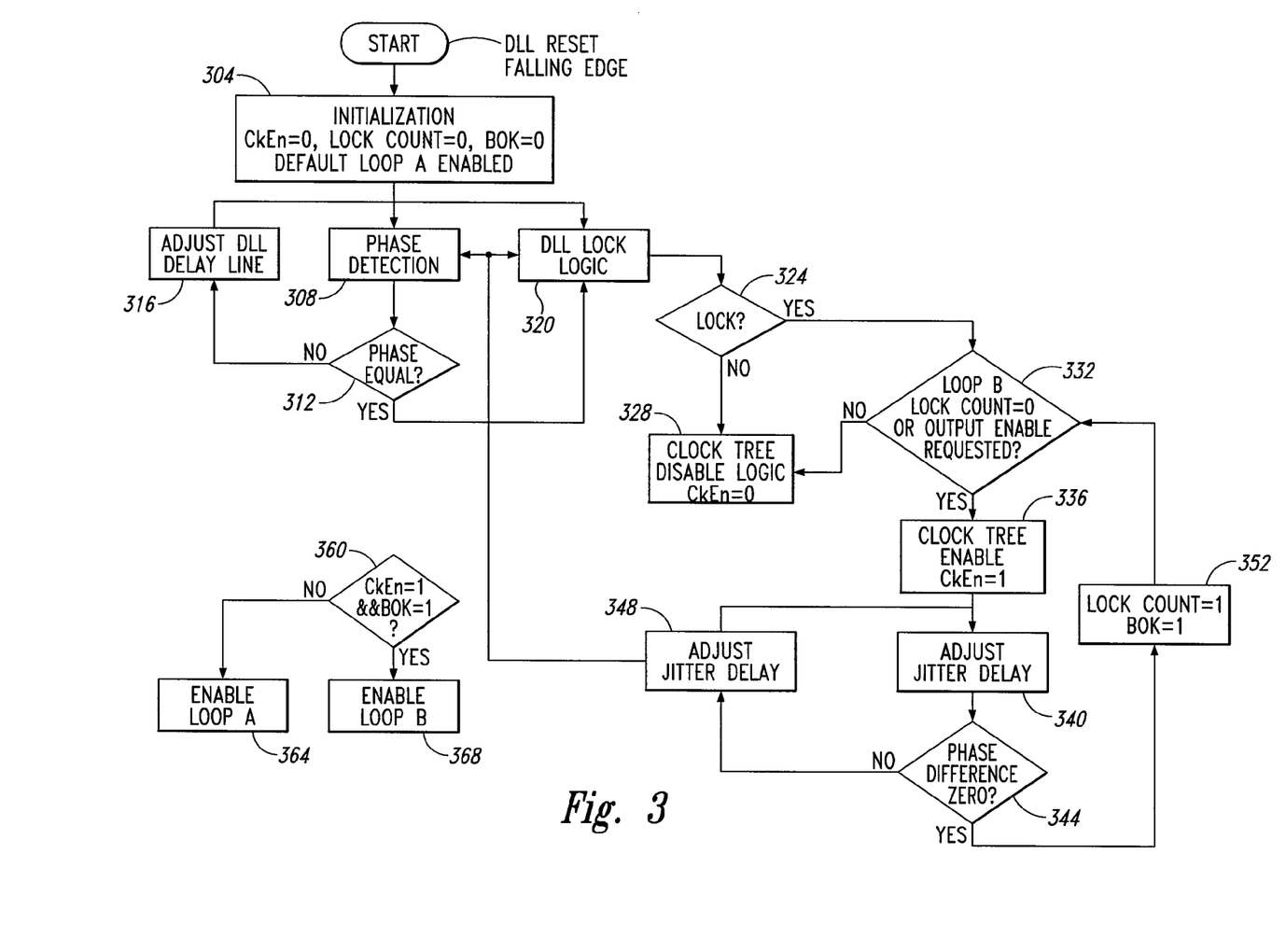
FIG. 3 is a flow diagram for operation according to an embodiment of the invention of the clock circuit of FIG. 2.

FIG. 3 illustrates operation of the clock generator 200 according to an embodiment of the invention. Upon reset of the clock generator 200, an initialization condition is set so that the clock circuit 100 can be initialized and locked. During initialization 304, the CkEn and BOK signals are inactive, and the lock count is set to zero. During a first step of the initialization process the FBCLK signal is routed through the multiplexer 222 and the model delay 124 to the phase detector 128 of the DLL 100. A phase difference between the FBCLK signal and the CLKS signal is detected 308 by the phase detector 128. If a difference is determined 312, the adjustable delay line 108 is adjusted 316 to reduce the difference. The process of detecting 308 a phase difference, determining 312 if the FBCLK and CLKS signals are synchronized, and adjusting 316 the delay of the adjustable delay line 108 is repeated until the FBCLK and CLKS signals are synchronized to obtain a locked condition 320. While the FBCLK and CLKS signals are not synchronized 324, the clock tree logic 140 remains disabled 328 (CkEn=0).

When a locked condition 320 for the DLL 100 is obtained, a determination 332 is made whether the delay loop of the clock jitter feedback circuit 210 has been previously locked or output enable is requested. Assuming that the clock jitter feedback circuit 210 has not previously been locked (e.g., initialization of the clock generator 200) the clock tree 140 is enabled 336 (CkEn=1), and the ICLK signal provided by the (now locked) DLL 100 is distributed as the DCLK signal. As previously discussed, the DCLK signal is provided to the clocked data register 214 of the clock jitter feedback circuit 210. As a result, clocking enabled data (e.g., switching between 0 and 1 at the RCLK frequency) is clocked out of the clocked data register 214 to the output buffer 218 in response to the DCLK signal. The output buffer 218 generates the FBDCLK signal that is provided to the phase detector circuit 230, which detects 340 a phase difference between the FBDCLK signal and the FBCLK signal. If a phase difference is determined 344, the jitter delay 238 is adjusted 348 to reduce the phase difference between the FBDCLK and FBCLK signals. The adjustments may be made through the use of a majority filter to average the phase difference decision after the jitter detector. The average depth may equal the delay (in terms of a number of clock periods) from ICLK to DQ outputs so that neither oscillation occurs nor wait time is needed. The process of detecting 340 a phase difference, determining 344 a phase difference, and adjusting the jitter delay 238 continues until the FBDCLK and FBCLK signals are in phase, at which time the jitter feedback circuit 210 is locked.

As the jitter delay 238 is adjusted to adjust the phase difference between the FBDCLK and FBCLK signals, the phase difference between the FBDCLK (output through the multiplexer 222 and the input buffer model delay 124 to the phase detector 128 as the DLLFB signal) and CLKS signals may change as well. Consequently, the DLL 100 may lose the locked condition and the delay line 108 adjusted to re-obtain a locked condition. Moreover, as the delay line 108 is adjusted, the phase of the DCLK signal (resulting from the ICLK signal) may shift, requiring the jitter delay 238 to be further adjusted. Thus, as shown in FIG. 3, while the jitter delay 238 is adjusted and the phase difference between the FBDCLK and FBCLK signals determined in order for the jitter feedback circuit 210 to obtain a locked condition, the delay line 108 may also be adjusted and the phase difference between the FBCLK (provided to the phase detector 128 as the DLLFB) and CLKS signals determined in order for the DLL 100 to (re-)obtain a locked condition.

Upon the jitter feedback circuit 210 (as well as the DLL 100) obtaining a locked condition, the lock count is set to one to indicate that the jitter feedback circuit 210 has been previously synchronized. Additionally, the BOK signal is set to one (by the shift logic 234) to indicate that the FBDCLK and FBCLK signals are synchronized. With the lock count set to one, the determination 332 results in the clock tree being disabled 328 (CkEn=0). Initialization of the clock generator 200 is complete.

During normal operation of the clock generator 200, a determination 360 is made based on whether data DQ is to be output or not. When data DQ is not being output, the clock tree 140 is disabled (CkEn=0) and the logic circuitry 250 outputs SelB=0, causing the multiplexer 222 to couple the FBCLK signal to the phase detector 128 as the DLLFB signal ("Loop A" enabled 368). The phase detector 128 detects the phase difference between the FBCLK and CLKS signals to adjust the adjustable delay 108 and maintain a locked condition. When data DQ is to be output, the clock tree 140 is enabled (CkEn=1) to provide a DCLK signal to clock the data register 154 and the output buffer 158, the logic circuitry 250 outputs SelB=1 causing the multiplexer 222 to couple the FBDCLK signal to the phase detector 128 as the DLLFB signal ("Loop B" enabled 368). The switching between Loop A and B may be triggered on the falling edge of the clock signal to provide a smooth transition without any partial clock pulses. The phase detector 128 detects the phase difference between the FBDCLK and CLKS signals to adjust the adjustable delay 108 to maintain a locked condition. With the FBDCLK signal output by the output buffer 218, the jitter phase detector 230 also detects the phase difference between the FBCLK and FBDCLK signals to adjust the jitter delay 238 as well. Switching the synchronization between Loop A and Loop B allows the clock generator 200 to adjust for jitter in the DQ outputs.

FIGS. 4A and 4B illustrate the general relationship between first order $t_{jitter}$ and first order derivative $\Delta t_{jitter}$ for a range of voltage (VLOW to VHIGH) and manufacturing process conditions (slow (SS), medium (TT), and fast (FF) process corners) for a conventional clock generator (FIG. 4A) and a clock generator according to an embodiment of the invention (FIG. 4B). In FIGS. 4A and 4B, it is assumed that the first order $t_{jitter}$ (i.e., "deterministic jitter") is clock timing jitter or data signal jitter that is predictable and reproducible. The peak-to-peak value of $t_{jitter}$ is bounded, and the bounds may be observed and predicted. As shown by FIG. 4A, the spread for $\Delta t_{jitter}$ is relatively wide (i.e., greater variation to $\Delta t_{jitter}$) over the voltage range and exhibits frequency dependency. In comparison, the $\Delta t_{jitter}$ for an embodiment of the invention is much tighter over the voltage range, and exhibits much less frequency dependency. In effect, FIG. 4B illustrates bounded conditions for the $\Delta t_{jitter}$, that is, the $\Delta t_{jitter}$ of the system is limited by upper and lower bounds.

Figure 5:
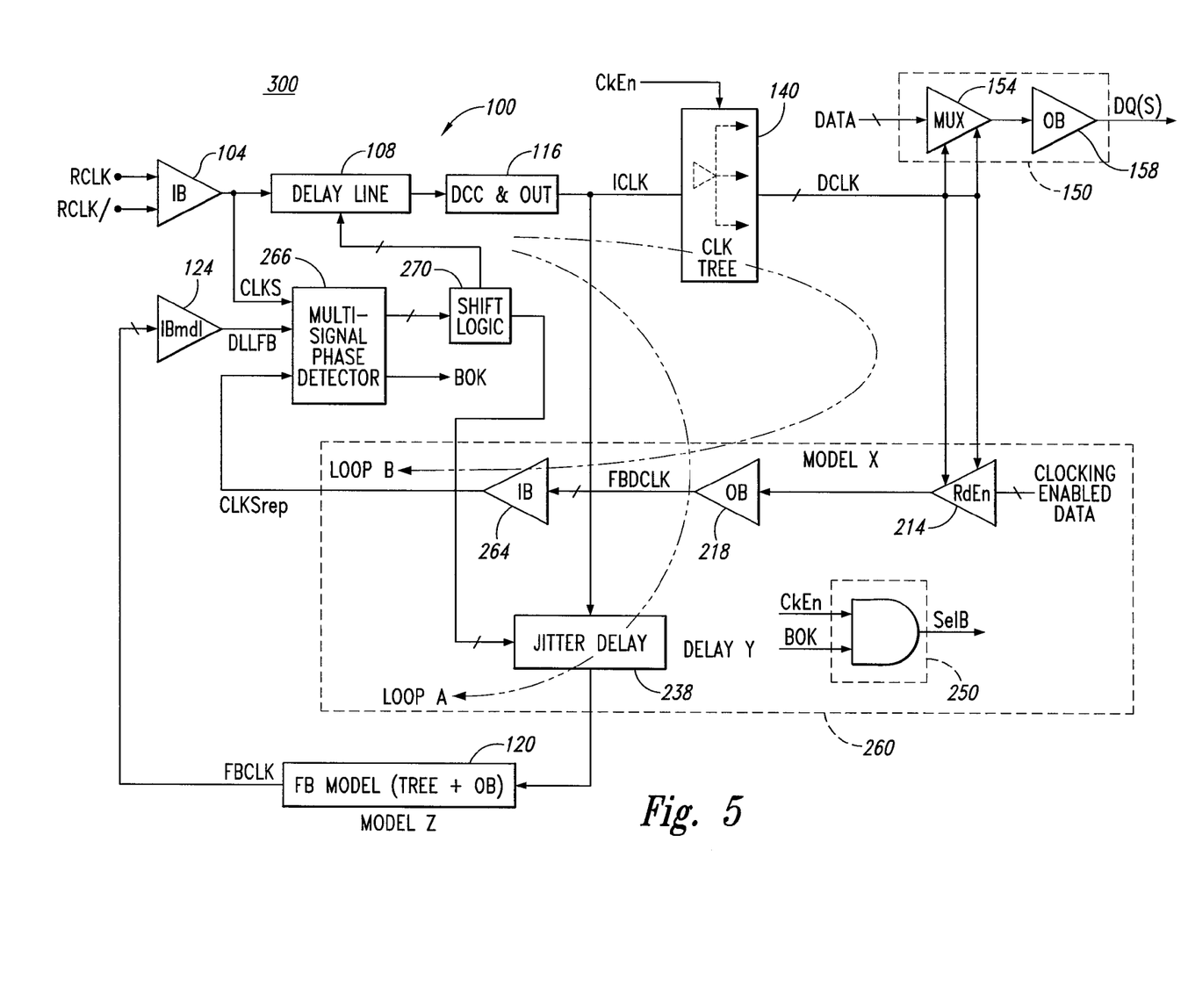
FIG. 5 is a block diagram of a clock circuit according to an embodiment of the invention.

FIG. 5 illustrates a clock generator 300 according to an embodiment of the invention. The clock generator 300 includes several previously described components, which are identified in FIG. 5 using the same reference numbers. The clock generator 300 also includes a jitter feedback circuit 260. The embodiment of the jitter feedback circuit 260 illustrated in FIG. 5 includes an input buffer 264 that receives the FBDCLK signal output by the output buffer 218. The input buffer 264 models the propagation delay of the input buffer model delay 124 and outputs a CLKSrep signal to a multi-signal phase detector 266. The multi-signal phase detector 266 detects differences between the multiple signals and generates an output signal indicative of the phase differences to shift logic 270. The shift logic 270, in response to the output signal from the multi-signal phase detector 266, generates delay control signals to adjust a delay of the delay line 108 and the jitter delay 238. The shift logic 270 additionally generates a BOK signal which is active when the CLKSrep and DLLFB (i.e., FBCLK signal) signals are synchronized.

Operation of the clock generator 300 is similar to that previously described with reference to FIGS. 2 and 3. Instead of providing either the FBDCLK signal or FBCLK signal through the multiplexer 222 to the phase detector 128, however, the FBDCLK signal is further delayed through the input buffer 264 to generate the CLKSrep signal that is provided to the multi-signal phase detector 266. The FBCLK and CLKS signals are provided to the multi-signal phase detector 266 as well. The multi-signal phase detector 266 detects the phase differences between the signals and generates delay control signals in response. The delay line 108 and jitter delay 238 are adjusted until both delay loops (i.e., Loop A and Loop B) are locked. Following initialization of the clock generator 300 and the locking of Loops A and B, the delay line 108 and/or the jitter delay 238 may be adjusted to account for jitter. For example, when data DQ is to be output, the clock tree 140 is enabled and an active CLKS rep signal is provided to the multi-signal phase detector 266 to determine if a delay adjustment is necessary to maintain synchronization between the CLKSrep signal and the CLKS and/or DLLFB signals.

Figure 6A:
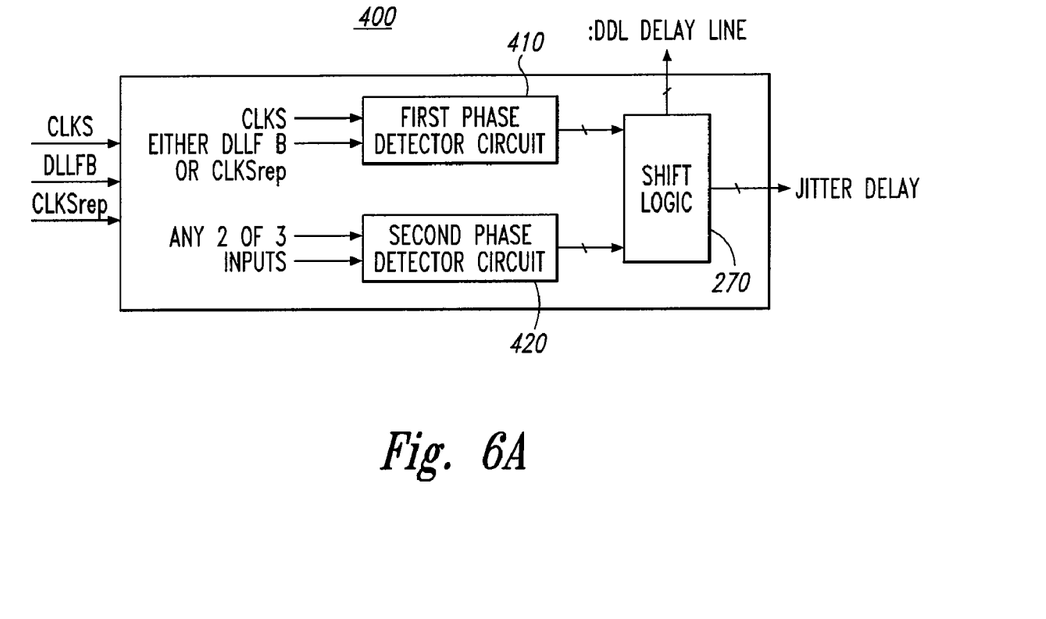
FIG. 6A is a block diagram of a multi-signal phase detector that may be used in a clock circuit according to an embodiment of the invention.

FIG. 6A illustrates a multi-signal phase detector 400 according to an embodiment of the invention. The multi-signal phase detector 266 of FIG. 5 may be implemented as multi-signal phase detector 400. The multi-signal phase detector 400 includes a first phase detector circuit 410 and a second phase detector circuit 420. In the embodiment shown in FIG. 6A, the first phase detector circuit 410 detects a phase difference between the CLKS signal and the DLLFB or CLKSrep signal and the second phase detector 420 detects a phase difference between two of three signals, CLKS, DLLFB, CLKSrep. The output of the first phase detector circuit 410 generates a phase difference signal to the shift logic 270, which provides a delay control signal to the DLL delay line 108. The output of the second phase detector circuit 410 generates a phase difference signal to the shift logic 270, which provides a delay control signal to the jitter delay 238. As known, a phase detector circuit detects a phase difference between input signals. Various designs for phase detector circuits are known to those ordinarily skilled in the art. The different designs may exhibit different resolutions of phase detection, that is, the incremental phase difference that can be detected by the phase detector circuit. In some embodiments, the phase detection resolution of the first and second phase detector circuits 410, 420 are the same. In other embodiments, the phase detection resolution of the first and second phase detector circuits 410, 420 are different. For example, the phase detection resolution for the second phase detector circuit 420 may be finer than that for the first phase detector circuit 410. Such an arrangement may provide greater accuracy to adjusting the adjustable delays to account for jitter.

Figure 6B:
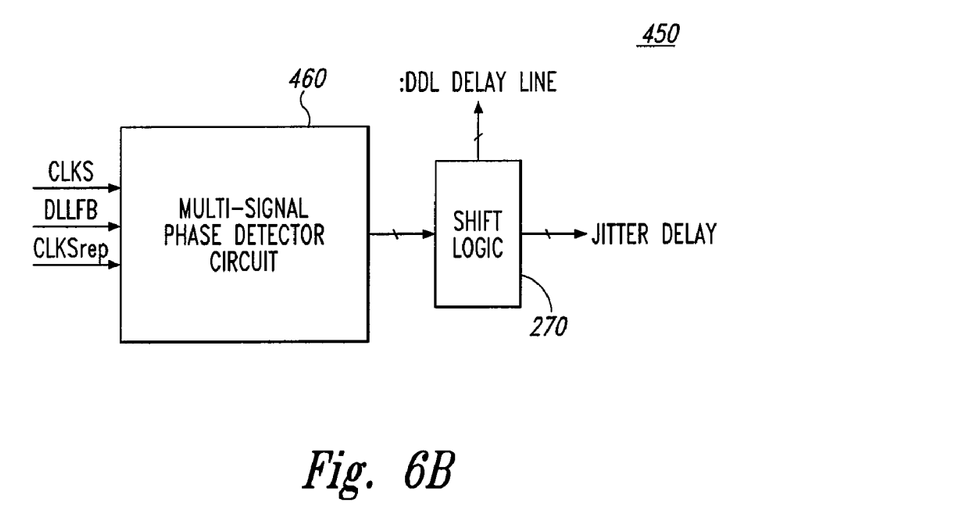
FIG. 6B is a block diagram of a multi-signal phase detector that may be used in a clock circuit according to an embodiment of the invention.

FIG. 6B illustrates a multi-signal phase detector 450 according to an embodiment of the invention. The multi-signal phase detector 266 of FIG. 5 may be implemented as multi-signal phase detector 450. The multi-signal phase detector 450 includes a multi-signal phase detector circuit 460 to detect phase differences between the CLKS, DLLFB, and CLKSrep signals to synchronize all three signals (within phase detection resolutions). The multi-signal phase detector circuit 460 generates a phase difference signal that is provided to the shift logic 270, which generates delay control signals for the DLL delay line 108 and the jitter delay 228. The multi-signal phase detector circuit 460 can be implemented by conventional multi-signal phase detector circuits known in the art.

Figure 7:
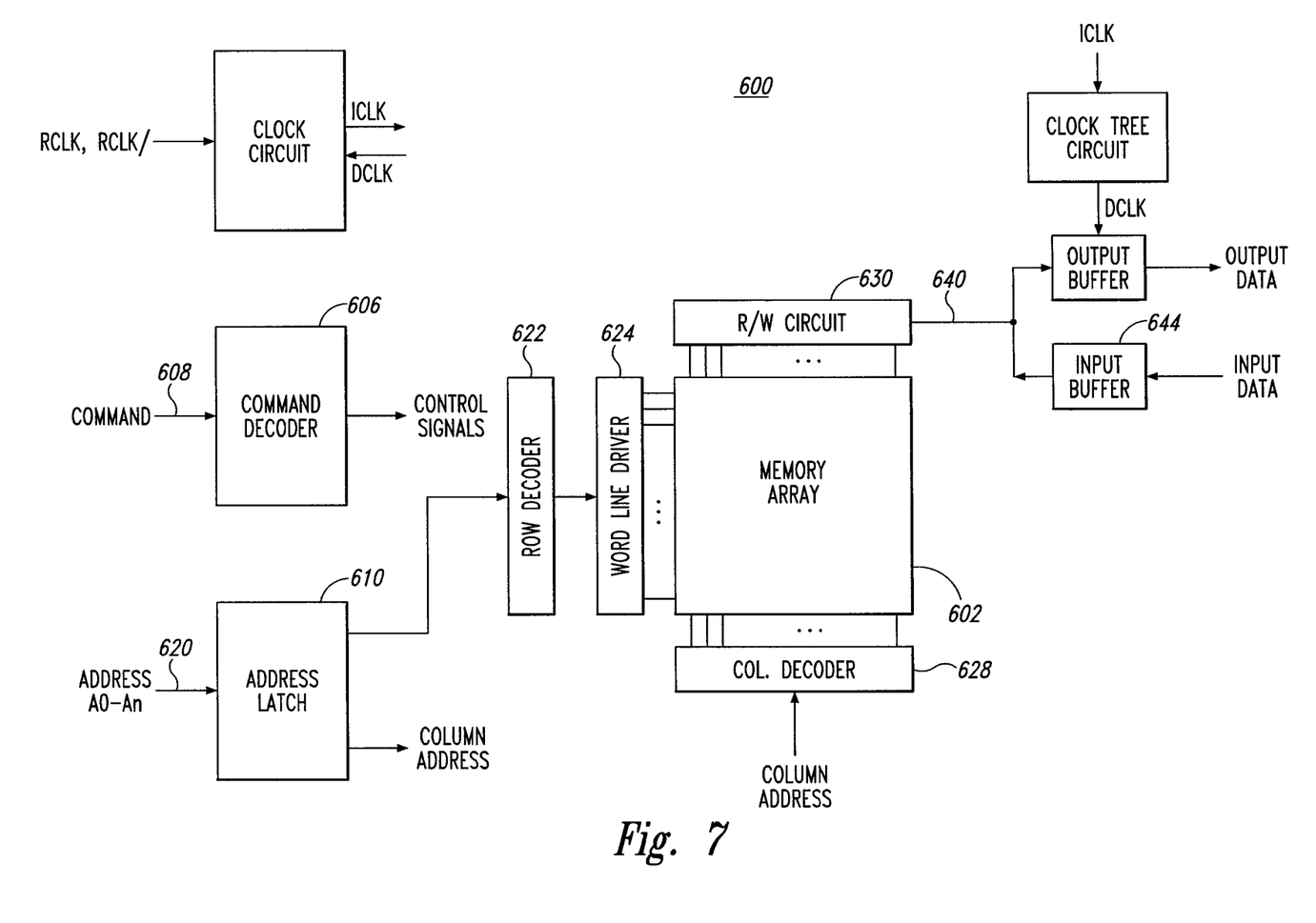
FIG. 7 is a block diagram of a memory including a clock circuit according to an embodiment of the invention.

FIG. 7 illustrates a portion of a memory 600 according to an embodiment of the present invention. A clock circuit 650 according to an embodiment of the invention is included in the memory 600. The memory 600 includes an array 602 of memory cells, which may be, for example, DRAM memory cells, SRAM memory cells, flash memory cells, or some other types of memory cells. The memory 600 includes a command decoder 606 that receives memory commands through a command bus 608 and generates corresponding control signals within the memory 600 to carry out various memory operations. Row and column address signals are applied to the memory 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. The clock circuit 650 provides an ICLK signal to the clock tree circuit 140. In response to the ICLK signal, the clock tree circuit 140 provides a DCLK signal for timing, for example, to clock the output buffer 634. Although not specifically shown in FIG. 7, the DCLK signal output by the clock tree circuit 140 can be used for timing different components as well. Write data are applied to the memory array 602 through a data input buffer 644 and the memory array read/write circuitry 630. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A clock circuit for generating a clock signal, comprising:
   a delay locked loop (DLL) configured to receive a reference clock signal and generate an output clock signal having an adjustable phase relationship relative to the reference clock signal, the DLL configured to adjust the phase relationship of the output clock signal in accordance with a phase difference between a buffered reference clock signal and a DLL feedback signal, the buffered reference signal based on the reference clock signal and the DLL feedback signal based on the output clock signal;
   a clock tree circuit coupled to the DLL and configured, when enabled, to distribute the output clock signal from the DLL in response to receiving the same;
   a clock jitter feedback circuit coupled to the clock tree and the DLL, the clock jitter feedback circuit configured to synchronize a clock jitter feedback signal and the DLL feedback signal and further configured to provide the clock jitter feedback signal to the DLL for synchronization with the buffered reference clock signal, the clock jitter feedback signal based on and generated in response to receiving a distributed output clock signal from the clock tree circuit.

2. The clock circuit of claim 1 wherein the clock jitter feedback circuit comprises:
   a feedback path coupled to the clock tree and having a delay circuit configured to provide a propagation delay modeling a propagation delay of data output circuitry;

a phase detector circuit coupled to the feedback path and the DLL, the phase detector configured to detect a phase difference between the DLL feedback signal and the clock jitter feedback signal and generate a phase difference signal indicative of a detected phase difference;

an adjustable delay circuit coupled to the DLL and configured to provide an adjustable delay to the output clock signal of the DLL in accordance with a delay control signal; and a delay control circuit coupled to the phase detector and the adjustable delay, the delay control signal configured to generate the delay control signal based on the phase difference signal from the phase detector circuit.

3. The clock circuit of claim 2 wherein the delay control circuit includes a majority filter configured to average the phase difference signal to generate the delay control signal.

4. The clock circuit of claim 2 wherein the feedback path comprises:
   a clocked data register coupled to the clock tree circuit and configured to output a clocked output signal according to a distributed output clock signal; and
   an output buffer coupled to the clocked data register and configured to buffer the clocked output signal therefrom to provide the clock jitter feedback signal.

5. The clock circuit of claim 1 wherein the clock jitter feedback circuit comprises a multiplexer configured to selectively couple the DLL feedback signal or the clock jitter feedback signal to a phase detector of the DLL to detect a phase difference between the coupled feedback signal and a buffered reference clock signal.

6. The clock circuit of claim 5 wherein the clock jitter feedback circuit further comprises a logic circuit configured to generate a selection control signal for the multiplexer in accordance with the logic states of a clock tree enable signal and a signal indicative of synchronization of the DLL feedback signal and the clock jitter feedback signal.

7. The clock circuit of claim 1, further comprising:
   a duty-cycle correction (DCC) circuit coupled to the DLL and configured to correct a duty cycle of the output clock signal; and
   an output buffer coupled to the DCC circuit and configured to buffer the duty-cycle corrected output clock signal.

8. A memory, comprising:
   a memory array;
   data output circuitry configured to output data from the memory array in response to a data clock signal;
   a clock tree configured to provide, when enabled, at least one data clock signal in response to an internal clock signal, the at least one data clock signal coupled to the data output circuitry; and
   a clock circuit configured to generate the internal clock signal in response to a reference clock signal, the clock circuit comprising:
      a delay locked loop (DLL) configured to receive the reference clock signal and generate the internal clock signal having an adjustable phase relationship relative to the reference clock signal, the DLL configured to adjust the phase relationship of the internal clock signal in accordance with a phase difference between a buffered reference clock signal and a DLL feedback signal, the buffered reference signal based on the reference clock signal and the DLL feedback signal based on the internal clock signal; and
      a clock jitter feedback circuit coupled to the clock tree and the DLL, the clock jitter feedback circuit configured to synchronize a clock jitter feedback signal and the DLL feedback signal and further configured to provide the clock jitter feedback signal to the DLL for synchronization with the buffered reference clock signal, the clock jitter feedback signal based on and generated in response to receiving at least one of the data clock signals from the clock tree circuit.

9. The memory of claim 8 wherein the clock jitter feedback circuit of the clock circuit comprises:
   a feedback path coupled to the clock tree and having a delay circuit configured to provide a propagation delay modeling a propagation delay of data output circuitry;
   a phase detector circuit coupled to the feedback path and the DLL, the phase detector configured to detect a phase difference between the DLL feedback signal and the clock jitter feedback signal and generate a phase difference signal indicative of a detected phase difference;
   an adjustable delay circuit coupled to the DLL and configured to provide an adjustable delay to the output clock signal of the DLL in accordance with a delay control signal; and
   a delay control circuit coupled to the phase detector and the adjustable delay, the delay control signal configured to generate the delay control signal based on the phase difference signal from the phase detector circuit.

10. The memory of claim 9 wherein the feedback path comprises:
    a clocked data register coupled to the clock tree circuit and configured to output a clocked output signal according to the data clock signal; and
    an output buffer coupled to the clocked data register and configured to buffer the clocked output signal therefrom to provide the clock jitter feedback signal.

11. A method for generating a clock signal, comprising:
    generating an output clock signal having a phase relationship to a reference clock signal;
    detecting a phase difference between a buffered reference clock and a DLL feedback signal, the buffered reference clock signal based on the reference clock signal and the DLL feedback signal based on the output clock signal;
    adjusting a first adjustable delay circuit to alter the phase relationship between the output clock signal and the reference clock signal in accordance with the phase difference between the buffered reference clock signal and the DLL feedback signal;
    generating a clock jitter feedback signal from a distributed output clock signal output from a clock tree circuit that receives the output clock signal;
    detecting a phase difference between the DLL feedback signal and the clock jitter feedback signal;
    adjusting a second adjustable delay circuit to alter the phase relationship between the DLL feedback signal and the clock jitter feedback signal; and
    synchronizing the DLL feedback signal and the buffered reference clock signal while the clock tree circuit is disabled and synchronizing the clock jitter feedback signal and the buffered reference clock signal while the clock tree circuit is enabled.

12. The method of claim 11 wherein generating a clock jitter feedback signal comprises:
    clocking a clocked register to output an alternating signal; and
    buffering the output of the clocked register and providing the buffered output as the clock jitter feedback signal.

13. The method of claim 11, further comprising:
    synchronizing the DLL feedback signal and the buffered reference clock signal;
    enabling the clock tree circuit to output distributed output clock signals;

synchronizing the clock jitter feedback signal and the DLL feedback signal;

adjusting the first adjustable delay to maintain synchronization of the DLL feedback signal and the buffered reference clock signal; and disabling the clock tree circuit.

14. The method of claim 11 wherein adjusting the second adjustable delay comprises averaging the phase difference using a majority filter.

15. The clock circuit of claim 4 wherein the feedback path further comprises an input buffer coupled to the output buffer and configured to further buffer the clock jitter feedback signal to generate a buffered clock jitter feedback signal to be synchronized with the DLL feedback signal.

16. The clock circuit of claim 1 wherein the DLL and clock jitter feedback circuit include a phase detector, the phase detector configured to detect a phase difference between at least two of the buffered reference clock signal, DLL feedback signal, and the clock jitter feedback signal and generate a first delay control signal for an adjustable delay of the DLL and a second delay control signal for an adjustable delay of the clock jitter feedback circuit.

17. The clock circuit of claim 16 wherein the phase detector comprises:

a first phase detector circuit configured to detect a phase difference between the buffered reference clock signal and at least one of the DLL feedback signal and clock jitter feedback signal and generate the first delay control signal; and a second phase detector circuit configured to detect a phase different between at least two of the buffered reference clock signal, DLL feedback signal, and the clock jitter feedback signal and generate the second delay control signal.

18. The clock circuit of claim 17 wherein the first and second phase detector circuits have first and second phase detection resolutions, respectively, the second phase detection resolution higher than the first phase detection resolution.

19. The memory of claim 10 wherein the feedback path further comprises an input buffer coupled to the output buffer and configured to further buffer the clock jitter feedback signal to generate a buffered clock jitter feedback signal to be synchronized with the DLL feedback signal.

20. The memory of claim 8 wherein the DLL and clock jitter feedback circuit of the clock circuit include a phase detector, the phase detector configured to detect a phase difference between at least two of the buffered reference clock signal, DLL feedback signal, and the clock jitter feedback signal and generate a first delay control signal for an adjustable delay of the DLL and a second delay control signal for an adjustable delay of the clock jitter feedback circuit.

21. The method of claim 12, further comprising further buffering the output of the clocked register and provide the output as the clock jitter feedback signal.

22. The method of claim 21 wherein detecting the phase difference between the buffered reference clock and the DLL feedback signal and detecting the phase difference between the DLL feedback signal and the clock jitter feedback signal and detecting the phase difference comprises detecting the phase difference between at least two of the buffered reference clock, the DLL feedback signal, and the clock jitter feedback signal at a multi-signal phase detector.

* * * * *